US009794499B2

United States Patent
Fahim et al.

(10) Patent No.: US 9,794,499 B2
(45) Date of Patent: Oct. 17, 2017

(54) WAFER-SCALE PIXELATED DETECTOR SYSTEM

(71) Applicant: Fermi Research Alliance, LLC, Batavia, IL (US)

(72) Inventors: Farah Fahim, Glen Ellyn, IL (US); Grzegorz Deptuch, Forest Park, IL (US); Tom Zimmerman, St. Charles, IL (US)

(73) Assignee: Fermi Research Alliance, LLC, Batavia, IL (US)

( * ) Notice: Subject to any disclaimer, the term of this patent is extended or adjusted under 35 U.S.C. 154(b) by 0 days.

(21) Appl. No.: 14/696,651

(22) Filed: Apr. 27, 2015

(65) Prior Publication Data
US 2015/0312501 A1 Oct. 29, 2015

Related U.S. Application Data (60) Provisional application No. 61/985,809, filed on Apr. 29, 2014.

(51) Int. Cl.
| | |
|---|---|
| *H04N 5/351* | (2011.01) |
| *H04N 5/335* | (2011.01) |
| *H01L 27/146* | (2006.01) |

(52) U.S. Cl.
CPC ....... *H04N 5/351* (2013.01); *H01L 27/14661* (2013.01); *H04N 5/335* (2013.01)

(58) Field of Classification Search
CPC .................................. H04N 5/335; G01T 1/24
USPC ....................................................... 348/294
See application file for complete search history.

(56) References Cited

U.S. PATENT DOCUMENTS

| | | | | |
|---|---|---|---|---|
| 3,774,018 A * | 11/1973 | Spreitzhofer | ........... | H03M 1/00 341/138 |
| 4,935,741 A * | 6/1990 | Reich | .................... | H03M 1/067 341/144 |
| 5,648,997 A * | 7/1997 | Chao | ........................ | A61B 6/06 378/147 |
| 5,675,341 A * | 10/1997 | Vallancourt | ........... | H03M 1/366 341/158 |
| 8,041,003 B2 * | 10/2011 | Astley | .................. | G01N 23/046 378/19 |
| 9,093,363 B2 * | 7/2015 | Sukegawa | ............. | H01L 25/167 |

(Continued)

OTHER PUBLICATIONS

Rudy Van De Plassche; Integrated analog-to-digital and digital-to-analog converters; 1994; Springer Science+Business Media Dordrecht; pp. 241, 243, 246, 248-249, 255.*

(Continued)

*Primary Examiner* — Roberto Velez
*Assistant Examiner* — Cynthia Segura
(74) *Attorney, Agent, or Firm* — Kevin Soules; Luis M. Ortiz; Kermit D. Lopez (57) ABSTRACT

A large area, gapless, detection system comprises at least one sensor; an interposer operably connected to the at least one sensor; and at least one application specific integrated circuit operably connected to the sensor via the interposer wherein the detection system provides high dynamic range while maintaining small pixel area and low power dissipation. Thereby the invention provides methods and systems for a wafer-scale gapless and seamless detector systems with small pixels, which have both high dynamic range and low power dissipation.

12 Claims, 8 Drawing Sheets

(56) References Cited

U.S. PATENT DOCUMENTS

| | | | | |
|---|---|---|---|---|
| 2002/0074637 | A1* | 6/2002 | McFarland | H01L 21/563 257/686 |
| 2004/0080637 | A1* | 4/2004 | Nakamura | H04N 5/243 348/255 |
| 2004/0095495 | A1* | 5/2004 | Inokuma | H04N 5/2253 348/308 |
| 2008/0042046 | A1* | 2/2008 | Mabuchi | H01L 27/14634 250/208.1 |
| 2008/0069733 | A1* | 3/2008 | Maltezos | B01L 3/50273 422/82.05 |
| 2008/0128697 | A1* | 6/2008 | Rieve | H01L 31/1055 257/54 |
| 2008/0165921 | A1* | 7/2008 | Tkaczyk | A61B 6/032 378/19 |
| 2010/0276572 | A1* | 11/2010 | Iwabuchi | H01L 27/1464 250/208.1 |
| 2010/0316184 | A1* | 12/2010 | Iwanczyk | A61B 6/032 378/19 |
| 2011/0051888 | A1* | 3/2011 | Astley | G01N 23/046 378/19 |
| 2012/0133054 | A1* | 5/2012 | Tkaczyk | G01T 1/243 257/777 |
| 2012/0133807 | A1* | 5/2012 | Wu | H04N 5/37455 348/272 |
| 2012/0228486 | A1* | 9/2012 | Herrmann | G01T 7/005 250/252.1 |
| 2012/0293698 | A1* | 11/2012 | Sukegawa | H01L 25/167 348/294 |
| 2014/0029150 | A1* | 1/2014 | Fledell | H02H 9/02 361/93.9 |

OTHER PUBLICATIONS

Becker, J. et al., "The high speed, high dynamic range camera AGIPD," 2013 IEEE Nuclear Science Symposium and Medical Imaging Conference, Seoul, Korea, Oct. 27-Nov. 2, pp. 1-5.

Shi, X. et al., "Challenges in chip design for the AGIPD detector," Nuclear Instruments and Methods in Physics Research A (2010) 624:387-391.

Becker, J. "AGIPD—The Adaptive Gain Integrating Pixel Detector for the European XFEL. Development and Status," 2011 IEEE Nuclear Science Symposium Conference Record, N39-5, pp. 1950-1954.

Hart, M. et al., "Development of the LPD, a High Dynamic Range Pixel Detector for the European XFEL," 2012 IEEE Nuclear Science Symposium and Medical Imaging Conference, N2-5, pp. 534-537.

IP, H. M. D. et al., "A Dynamic Slew Correction Circuit for Low Noise Silicon Detector Pre-amplifiers," IEEE Transactions on Nuclear Science (2012) 59(3):642-646.

Hatsui, T., "Development and Deployment Status of X-ray 2D Detector for SACLA," Pixel (2012) 33 pages.

Hatsui, T. et al., "A direct-detection X-ray CMOS image sensor with 500 μm thick high resistivity silicon," Proc. Int. Image Sensor Workshop (2013) vol. 3, 4 pages.

* cited by examiner

Legend
105 - Sensor
110 - Interposer
115 - Metal Layer
120 - Metal Layer
125 - ASIC
130 - ASIC
135 - ASIC
140 - VIA
145 - VIA
150 - VIA
160 - Front End

Legend
510 - Band Gap
515 - Band Gap
520 - Power on Reset
530 - Pixels

WAFER-SCALE PIXELATED DETECTOR SYSTEM

CROSS REFERENCE TO RELATED PATENT APPLICATIONS

This patent application claims the priority and benefit of U.S. provisional patent application 61/985,809, entitled "WAFER-SCALE PIXELATED DETECTOR SYSTEM WITH LARGE AREA, LARGE DYNAMIC RANGE AND EASILY EXPANDABLE", filed on Apr. 29, 2014. This patent application therefore claims priority to U.S. Provisional Patent Application Ser. No. 61/985,809, which is incorporated herein by reference in its entirety.

STATEMENT OF GOVERNMENT RIGHTS

The invention disclosed in this application was made with Government support under the Fermi Research Alliance, LLC, Contract Number DE-AC02-07CH11359 awarded by the U.S. Department of Energy. The Government has certain rights in the invention.

FIELD OF THE INVENTION

The present invention is related to a large area, highly segmented camera system. The invention is further related to methods and systems for a wafer-scale gapless and seamless radiation detector with small pixels, which has both high dynamic range and low power dissipation.

BACKGROUND

Currently available hybrid pixel detectors are constructed by bonding custom Application Specific Integrated Circuits (ASICs) to a relatively small sensor slab. Coverage of a larger area is then obtained by tiling or shingling together some number of modules, which leads to gaps in coverage along the module boundaries.

The architecture of existing pixel front-end circuitry for large dynamic range is typically an adaptive-gain active integrator, which is a high gain amplifier with switchable capacitors in the feedback loop. Different capacitors are switched in on-the-fly during integration, depending on the signal amplitude. To achieve large dynamic range with this scheme, the total integration capacitance must be large, which forces either large pixel size or limited dynamic range. In addition, an image of the signal charge must be actively sourced with high bandwidth by the amplifier and power supply, requiring relatively large bias currents and unacceptably high power dissipation.

Therefore, there is a need in the art for new methods, systems, and apparatuses for wafer-scale gapless and seamless detectors with small pixels, which have both high dynamic range and low power dissipation.

SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the disclosed embodiments to provide a gapless detector.

It is another aspect of the disclosed embodiments to provide a gapless detector comprising a sensor and an application specific integrated circuit.

It is another aspect of the disclosed embodiments to provide methods and systems for a wafer-scale gapless and seamless detector systems with small pixels, which could include a large area interposer.

It is yet another aspect of the disclosed embodiments to provide an electrical network of a multi-channel system of the front-end circuit for processing of signals from a radiation sensor which has both high dynamic range and low power dissipation.

The technology disclosed herein, related to large area and large dynamic range pixel detectors with no dead space, are of interest in a wide range of applications from correlated X-ray spectroscopy, diffraction studies, high flux pump probe, small molecule imaging, and compressed matter states, etc. It is also applicable for all types of position sensitive detectors, timing and energy spectroscopic detectors in High Energy and Nuclear Physics, Photon Science, and Material Science, etc. The embodiments can be extended to other applications where segmentation is important, for example, on digital read out Geiger-mode avalanche photodiodes, known also as digital Silicon Photo-Multipliers (SiPMs). The range of potential uses also includes medical imaging, for example, high sensitivity clinical radiography.

The aforementioned aspects and other objectives and advantages can now be achieved as described herein. A method and system for a large area, gapless, detection system comprises at least one sensor; an interposer operably connected to the at least one sensor; and at least one application specific integrated circuit operably connected to the sensor via the interposer wherein the detection system provides high dynamic range while maintaining small pixel area and low power dissipation. Thereby the invention provides methods and systems for a wafer-scale gapless and seamless detector systems with small pixels, which have both high dynamic range and low power dissipation.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

GLOSSARY OF TERMS: The following terms describe various aspects of the embodiments of the invention.

Wafer scale: Large area, seamless structure (without any dead zones). In relation to the methods of fabrication of integrated circuits, an obvious size unit is a wafer, but, generally, the scale is herein not limited to any particular geometry (shape, size, or thickness), it can conceivably also be a part of a wafer cutout or any other geometry.

Large dynamic range: $1\times10^2$ e– to $1\times10^{10}$ e–. The upper limit is restricted by pixel size in combination with capability of a sensor to deliver charge packets without collapsing the electric field in the sensor or affecting the charge collection in any other way, to cover the entire dynamic range, gain can be divided in ranges, the number of gain ranges can be multiple with the minimum number equal to 1 and the maximum not specifically defined but limited by parameters, like pixel size, power requirements, or as required by an application.

Pixilated ASIC: An Application Specific Integrated Circuit (ASIC), which contains an array of at least one pixel which includes an entire processing chain with or without additional functions located at the chip periphery. The layout of pixels and of the pixel arrays is not restricted to any particular geometry or functionality. All pixels have input pads for connecting to sensor.

Pixilated sensor: Any large area pixilated is segmented sensing material, which produces charge signals in response to incident radiation. Its segmentation defines pixels.

Interposer: A large area sheet, which can be covered with additional metal layers on top and bottom such that each metal layer is isolated by a dielectric layer. The metal layers can be patterned to create electrically conducting routing traces. The sheet material can be semiconductor (e.g., Silicon) or dielectric (e.g., glass). It also consists of thru holes (depending on the type of material, they are also called TSV, thru silicon via, or TGV, thru glass via). The thru hole (TSV/TGV) can be used to make one or more connections between the innermost top and bottom metal layers. The thru holes can be plugged or plated to make an electrical connection. Preferably, the thru holes need to be isolated from the substrate, such that there are no unwanted or parasitic connections between them. Electrical connection across the metal layers can be made using inter-metal connection vias. The outermost top and bottom metal layers can be used to also make pads, which are used to bond components on both sides. Any number of metal layers and traces can be used for connectivity between one or more detector pixels to one or more ASIC pixels.

Tapering: Pitch adaptation achieved through routing of one or more metal layers on the interposer to connect a sensor and an ASIC with different pixel sizes. Tapering can be achieved by metal routing; this is one key part of building a gapless detector through adaptation of intentionally different pixel pitches on a sensor and on an ASIC.

Readout: Readout schemes include either extraction of data in analog or digital form following selective-sparsified or raw-unprocessed information flow from the chips.

Application: Any application that requires large area imaging including, but not limited to, high energy physics, medical imaging, imaging for photon science, etc.

Embodiments described herein are for a pixilated detector system whose basic module size well exceeds that of any currently available device. Its size can be equal to that of a full sensor wafer and the embodiments described herein can be completely seamless with no dead zones. The system consists of three major components: a wafer-scale sensor with any number of pixels—preferably up to the order of a million pixels or greater depending on its size; an interposer, such as a Silicon interposer (also called a Silicon Printed Circuit Board or SiPCB) or a glass interposer, which serves as an interconnection device and pitch adapter between the entire sensor wafer (and sensor wafer pixels) and a number of smaller readout Application Specific Integrated Circuits (ASICs) (and ASIC pixels); and the third component is one or more custom front-end readout ASICs (which contain one or more pixel arrays). The custom front-end readout ASICs may include pixels up to and including tens of thousands of pixels, which implements a novel design concept to achieve high dynamic range while maintaining both small pixel area and low power dissipation.

Figure 1:
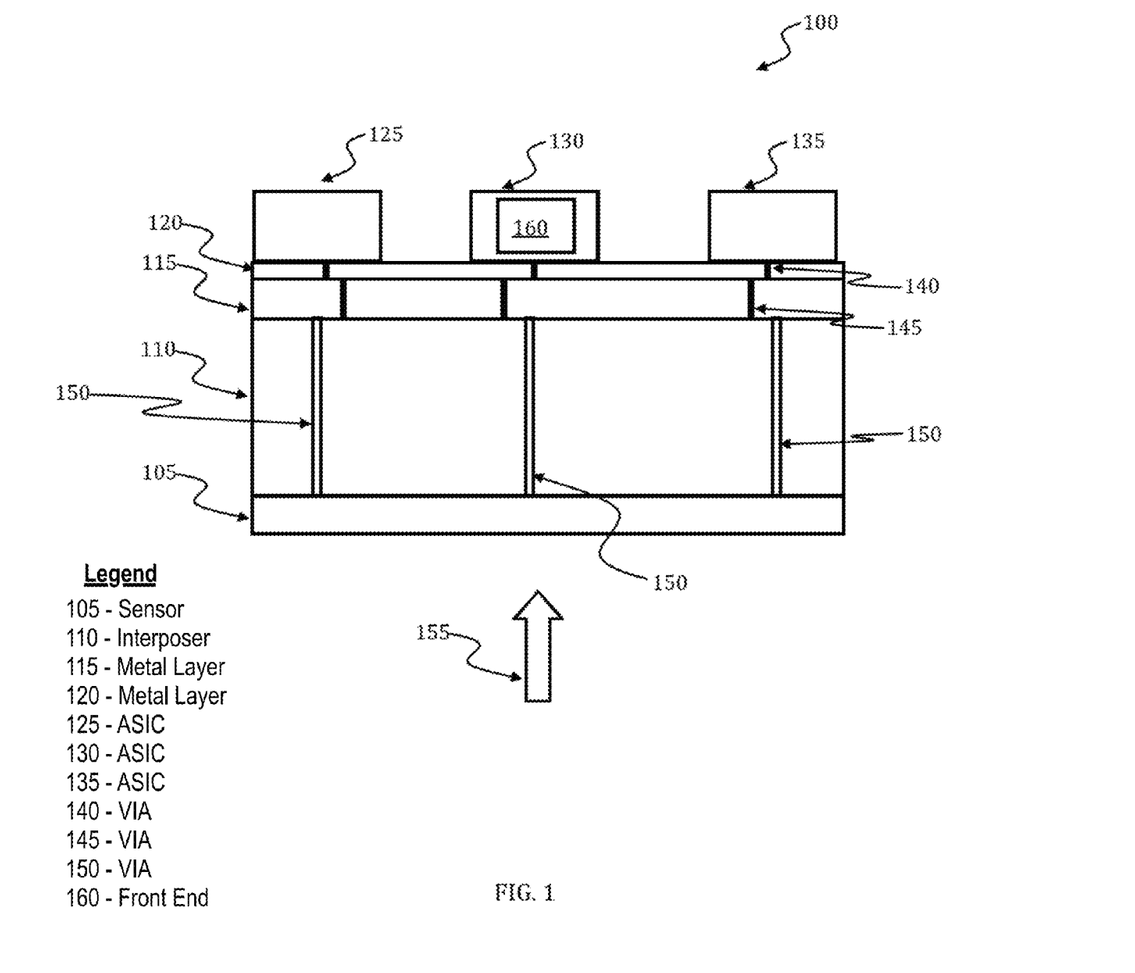
FIG. 1 depicts a block diagram of a large area, highly segmented pixilated detector system in accordance with the disclosed embodiments.

In one embodiment, illustrated in FIG. 1, the invention comprises a large area, highly segmented pixilated detector system 100 whose basic module size well exceeds that of any currently available device. Its size, for example, can be equal to that of a full sensor wafer and the system 100 is completely seamless with no dead zones. The sensor 105 serves to collect illumination such as X-rays or other radiation, illustrated by arrow 155. The system 100 consists of a sensor 105, which is preferably wafer scale and may have on the order of a million pixels. An interposer 110 is operably connected to the sensor 105 and serves as an interconnection device and pitch adapter between the sensor wafer pixels on the sensor 105 and a number of smaller readout ASICs 125, 130, and 135. The interposer 105 may be an SiPCB or other such known device. The custom front-end readout ASICs 125, 130, and 135 can have multiple processing channels arranged in an array of 1 or more pixels. In one embodiment, this may include any number of pixels. It should be appreciated that any number of ASICs may be equivalently used, and the illustration of three such ASICs is exemplary only and not intended to limit the scope of the invention. It should be understood that ASICs 125, 130, and 135 could all include the same circuit topology and functionality, or one or more of ASICs 125, 130, and 135 could have one or more different circuit topologies and could have one or more different pixel and/or peripheral functionalities depending on design considerations.

Interposer 105 can include a (semiconductor/dielectric) sheet layer 110 and several metal layers such as 115 and 120. Layers 110, 115, and 120 are all electrically isolated from each other using dielectric layers (not shown). These three layers are shown merely for purposes of illustration and more or fewer layers may be included as necessary depending on design consideration. The interposer may include vias 150 which are holes through the various layers of the interposer. These vias 150 can be plugged or plated with conducting material to provide electrical connection between the metal layer (115) on the top and another layer at the bottom. They are however isolated from each other. One or more of layers 115 and 120 may also include a plurality of electrically conducting inter-metal via connections 140 and 145. The thru holes, metal layer traces, and inter-metal vias together provide electrical connection between the sensor 105 and the various ASICs 125, 130, and 135. The interposer 105 can also include a pad configured to bond various components to the interposer 105. The interposer 105 is configured for re-routing and tapering of the detector pixel associated with the sensor 105 to pixels associated with ASICs 125, 130, and 135, so that there are enough gaps for power and signal routing on the interposer 105 and placement for passive components between ASICs. This also allows area for peripheral functionality on the ASIC itself.

Another component of the invention is the front-end 160, which may be embodied as a pixel or an array of pixels within ASIC 125, 130, and/or 135, and associated electronics. The front end 160 is configured to absorb photon pulses over a large dynamic range within a small pixel area and requires low power consumption. The pixel area may be any area, but is preferably approximately 100 microns on a side. Low power consumption is achieved with a concept referred to as current splitting with multiple scaled ranges. The front end 160 electronics require integration of a wide dynamic range charge (1 fC to 100 pC) from the detector. In order to achieve both the required precision at the low end and adequate dynamic range, an 'intelligent' front end where the sensitivity changes with signal size is required. This is challenging because of the potentially large value of charge that must be integrated and the large transient currents involved. The front-end 160 may be embodied as a pixel front-end in ASIC 125, 130, and/or 135.

Figure 2:
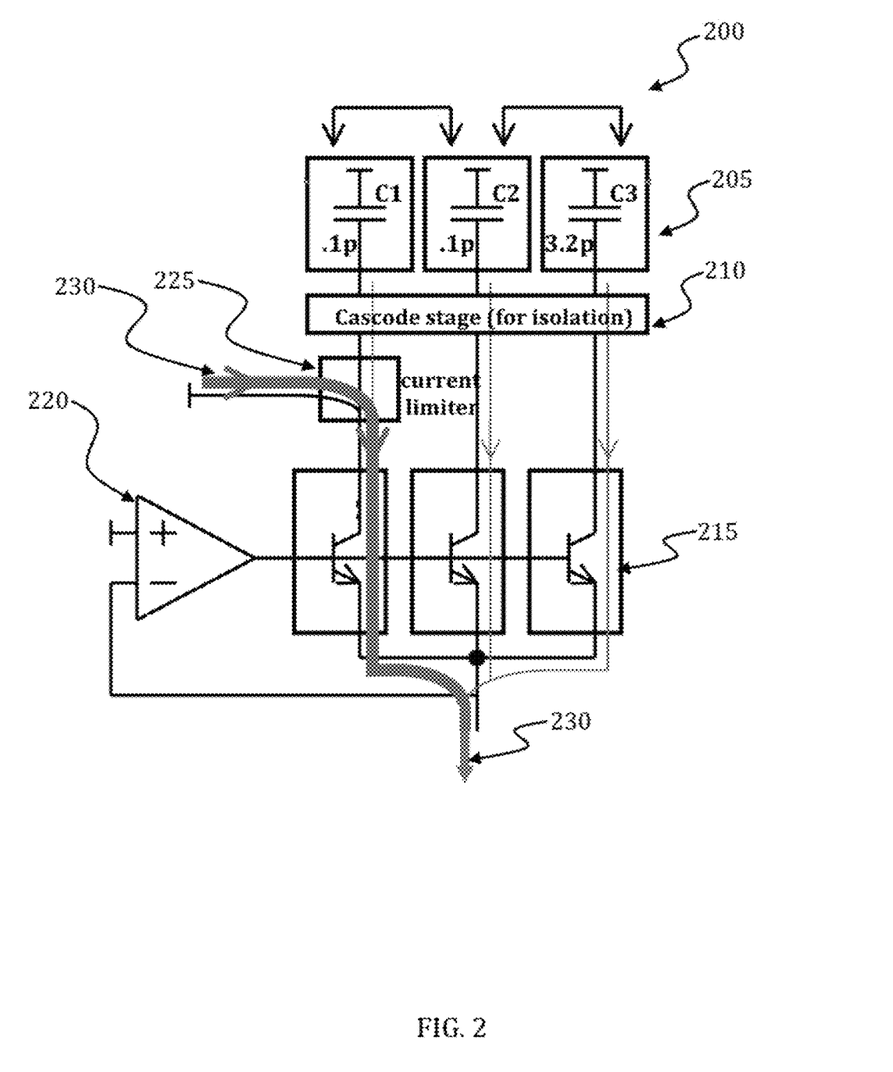
FIG. 2 depicts a block diagram of an electrical network of a front-end circuit based on a bipolar current splitter in accordance with the disclosed embodiments.

FIG. 2 illustrates an electrical network of a bipolar current splitter 200 associated with the front end 160. Bipolar current splitter 200 includes passive integrators 205, cascade stage 210, 3-range current splitters 215, feedback amplifier 220, and current limiter 225. The current limiter could be placed before or after the cascade stage. FIG. 2 illustrates a passive excess charge dump 230. It should be understood that this arrangement could be replaced by active integrators (not shown) depending on design considerations.

The current splitters 215 can be formed from several bipolar transistors with paralleled base-emitter junctions and scaled emitter areas. All the emitters of these bipolar transistors are connected together; similarly, all the bases can also be connected together. Bipolar transistors may be required because unlike MOSFET (Metal Oxide Semiconductor Field Effect Transistor), they have the unique property of maintaining a constant split ratio over very wide dynamic range, even in the presence of random transistor mismatch. The current splitter must have low input impedance in order to keep the detector bias voltage constant and to absorb the signal charge quickly. Therefore, it is incorporated into a feedback amplifier 220, which requires only modest DC bias current. Each of the splitter outputs feeds either a passive or an active integrator 205. In this way, the signal itself is integrated and does all the work.

This architecture has several advantages. With current splitting and excess charge dumping, the power supply does not have to actively source an image signal charge. This keeps the required area and power low. For large signals where the top (least sensitive) range is relevant, the top range integrator sees only a small well-known fraction of the signal current. Therefore, the required integration capacitance value (and pixel area) is much smaller than would be otherwise required, resulting in a very significant area benefit. Preferably the biggest integration capacitance value required is approximately 3 pF, as opposed to 100 pF or more, which may be required for classical charge sensitive amplifiers. In addition, the large signal current on the most sensitive range can be simply shunted away to AC ground, or "dumped," as shown by arrow 230, since it carries no additional useful information. Since all ranges integrate simultaneously, the input cannot be polluted with any switching transients.

Figure 3:
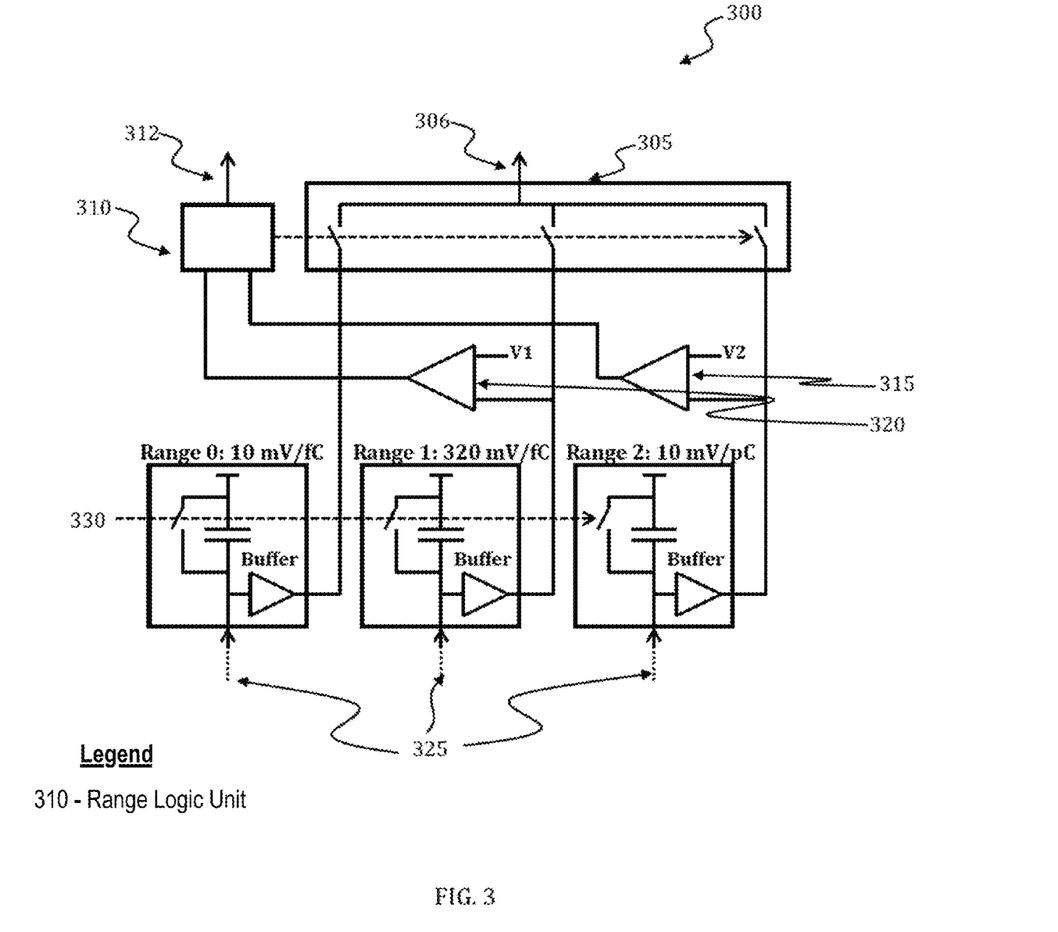
FIG. 3 depicts a block diagram of a gain selector in accordance with the disclosed embodiments.

FIG. 3 illustrates system 300 and associated components for selecting the most suitable gain range to store. The system 300 includes integrator inputs 325 from the 3-range current splitter, such as that illustrated in FIG. 2. Reset switches 330 are provided. Discriminators 315 and 320 are operably connected to range logic unit 310, which provides a digital range code shown by arrow 312. A multiplexer 305 also provides analog output to a storage array as shown by arrow 306.

Figure 4:
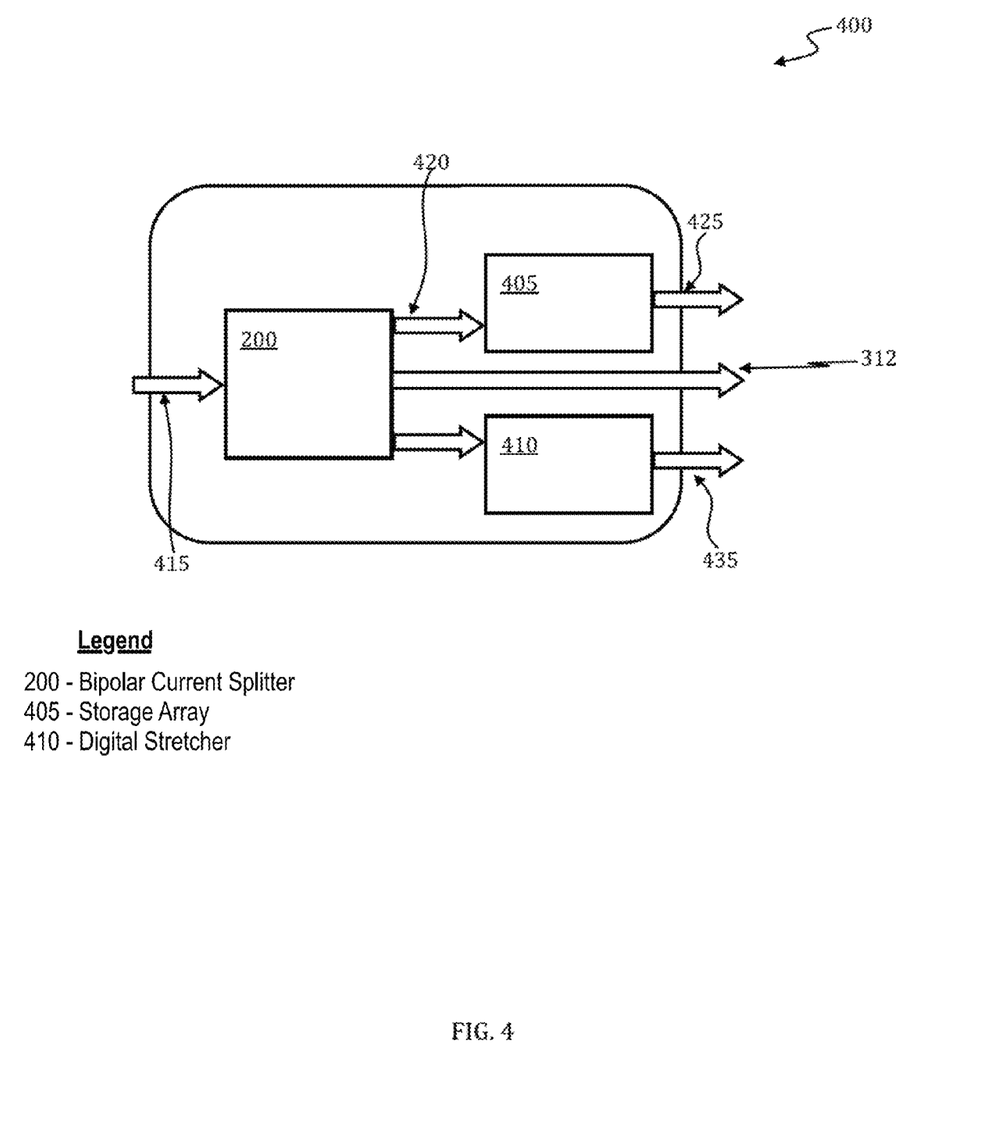
FIG. 4 depicts a block diagram of a system in accordance with the disclosed embodiments.

FIG. 4 illustrates a block diagram of a system 400 associated with methods and systems described herein. System 400 receives input 415 from the sensor. Current splitter 200 then provides an analog output 420 to analog storage array 405. The analog storage array can then provide a pixel analog output 425. The current splitter 200 also provides a digital range code 312 and input to a digital stretcher 410. Digital stretcher 410 provides a pixel digital output 435.

Analog storage array 405 provides in-situ storage of any number of one or more images in the ASIC (the actual number results from satisfying the application needs, but can be larger with some impact on the pixel footprint). The ASIC acquires signals from the sensor and stores the results in the in-pixel capacitor storage bank. In this way, the ASIC can, for example, take multiple images at a rate commiserate with the source. After the frames are taken and stored in the ASIC, the images are read out to a data acquisition system at a slower speed.

In the front-end scheme illustrated in FIGS. 2-4, the signal current is simultaneously integrated on multiple ranges with different sensitivities, and then based on the signal amplitude, one appropriate range is chosen for digitization. The signal current is divided into several scaled ranges with a current splitter, such as current splitter 200, and integrated simultaneously on all ranges with simple passive, resettable integrators. There is no on-the-fly range switching during integration. The scaling factor between ranges is set by a combination of current split ratios and integration capacitance ratios. With only three ranges, a scaling factor of one thousand may be achieved between the highest and lowest ranges. The ratios given by a number of transistor and integrating capacitors in the figures are given for reference only, other values can be used without changing the principle. In other embodiments, active integrators can be used alternatively.

The presence of multiple ranges of signal integration requires a digital range selector, whose sole role is to choose the appropriate measurement range for storing the signal amplitude after the signal has been integrated. Range comparators detect the highest "saturated" range and then choose the next highest range output for storage. The back-end part of a pixel may have various functionalities including, for example, in-situ storage of images acquired in bursts at high speed. The images can be acquired at frequencies in the multi-MHz range. It could also include analog to digital converters (ADC) to digitize the stored analog value. Depending on the available area, these ADC's can also be located in the ASIC periphery.

In one embodiment of system 100, preferable design parameters include: tapering from a large detector pixel to a small ASIC pixel. This may be from 150×150 $\mu m^2$ on the sensor side to about 130×130 $\mu m^2$ on the ASIC side. The tapering connection is achieved in the interposer. Preferably, a full reticle size ASIC of 19.6 mm×21.6 mm may contain 22500 pixels (150×150 pixels array). This corresponds to an active pixel area of 19.5 mm×19.5 mm. The additional space on the ASIC may be used for peripheral circuits that include, but are not limited to: bandgap reference circuitry DACs to generate on-chip biases, digital and analog buffers, pads for providing power to the ASIC, decoupling of biases, analog output of storage capacitors, and analog to digital converters. It should be appreciated that each pixel associated with an ASIC connects to a sensor pixel of larger geometry. Thus, an array of 150×150 pixels occupies an area of 22.5 mm×22.5 mm.

The interposer can be any thickness, but may be preferably selected to be up to several hundred micrometers in order to provide shielding of ASICs from radiation damage such as exposure to radiation fluxes from the backside.

The sensor 105 may include multiple pixels of any size and geometrical arrangement. The sensor 105 wafer may be permanently fusion bonded, or bonded by any other known surface-to-surface bonding means, to one side of the interposer 110, which may be, for example, an SiPCB wafer. The SiPCB interposer 110 can comprise multiple layers of metal to taper the smaller pixel size on the ASIC to the larger pixel size in the sensor 105. The taper allows multiple ASICs to be bonded to the SiPCB on the side opposite the sensor 105. ASICs can be tested and only known good dies can be selected in order to improve yield.

The smaller pixel size on the ASIC (compared to the sensor pixel size) provides spacing between the ASICs. With this geometry the vertical and horizontal space between ASICs may be any number, but is typically up to a few mm. These limits may not be symmetrical in vertical and horizontal spaces between ASICs depending on where and how the periphery is placed in the ASIC. The additional horizontal/vertical space can be used for routing power and analog signals from the ASIC to the connector. Other components for decoupling, biasing, or buffering can also be placed in these spaces.

In a preferred embodiment for the Advanced Photon Source at Argonne (APS), the smaller pixel size on the ASIC (compared to the sensor pixel size) provides adequate spacing between the ASICs. With this geometry, the vertical and horizontal space between ASICs may preferably be 0.9 mm and 2.9 mm, respectively. These limits may be interchangeable depending on where and how the periphery is placed in the ASIC. The additional horizontal space can be used for routing power and analog signals from the ASIC to the connector. In-situ storage of at least 48 images in the ASIC (the actual number results from satisfying the application needs but can be larger, with some impact on the pixel footprint). The ASIC acquires signals from the sensor and stores the results in the in-pixel capacitor storage bank. In this way, the ASIC can, for example, take 48 images at a frame rate of 6.5 MHz. After the 48 frames are taken and stored in the ASIC, the images are read out to a data acquisition system at a slower speed.

In another embodiment, the sensor 105 can be a standard design, although it is a full wafer dead-area-free device. The preferable sensor material is silicon, but other known materials may alternatively be used. For example, other materials such as CdTe, CdZTe, Ge, GaAs, etc., can be used in some applications.

The interposer 110 is also preferably of wafer size and is permanently attached to the sensors using a wafer fusion bonding technique or other known surface-to-surface bonding technique. The interposer 110 is a device featuring thru (Silicon or Glass) Vias, (TS/GVs), such as vias 150 and several metal routing layers. The fused sensor and interposer form a flat bed, to which multiple ASICs 125, 130, and 135 can be bump bonded (as an example, the fused assembly can be made of an 8-inch diameter sensor wafer and multiple 2×2 cm^2 ASICs). The major role of the interposer is to taper a larger pixel size on the sensor 105 to a smaller pixel size on the ASICs 125, 130, and 135, which creates space between ASICs 125, 130, and 135 for adequate placement clearance, trace routing, and discrete components. This tapered structure enables the seamless output of the system and avoids the modular nature that is typical of existing hybrid detectors. The interposer 110 also has the benefit of shielding the ASICs from radiation damage.

In another embodiment, the invention comprises a detector, front end electronics, and includes wafer scale integration as described below.

In this embodiment, a detector or sensor 105 may comprise an NPN bipolar current splitter. The detector may comprise an n-on-p or an n-on-n sensor as it can deal only with one polarity of collected charges. Alternatively, if supporting technology allows. PNP splitter can be used for p-on-n type sensors.

In one embodiment supporting applications associated with APS, the frontend electronics illustrated in FIGS. 2-4 and described above may be used in 24/48 bunch mode. For pump-probe experiments, and other such applications, which generally store a pump image and probe image using the same x-ray bunch, 48 images can be stored in an ASIC. This allows storage of 24 pump images and 24 probe images, corresponding to two images per x-ray bunch. The x-ray bunches may come at 150 ns intervals. The ASIC can be designed to acquire the signal from the sensor and transfer the charge to a capacitor storage bank in this time period. In this way, the ASIC can take 48 images at a frame rate of 6.5 MHz (1/153 ns). After the 48 frames are taken and stored in the ASIC, the images are read out to a data acquisition system at a slower speed. Other acquisition rates and/or numbers of stored images can be used depending on the type of application.

It is possible to further utilize the capacitor storage bank by observing that for most exposures, any single pixel will have acquired no photons, especially for weak scattering samples. Using this fact, an n bit digital stretcher for low flux operation can be included in the pixel to only store charge in the capacitor bank if photons exist, the digital circuitry will provide information about the time bucket. In this way, the capacitors can enable the storage of many more images for low photon fluxes in local areas of the detector.

Figure 5:
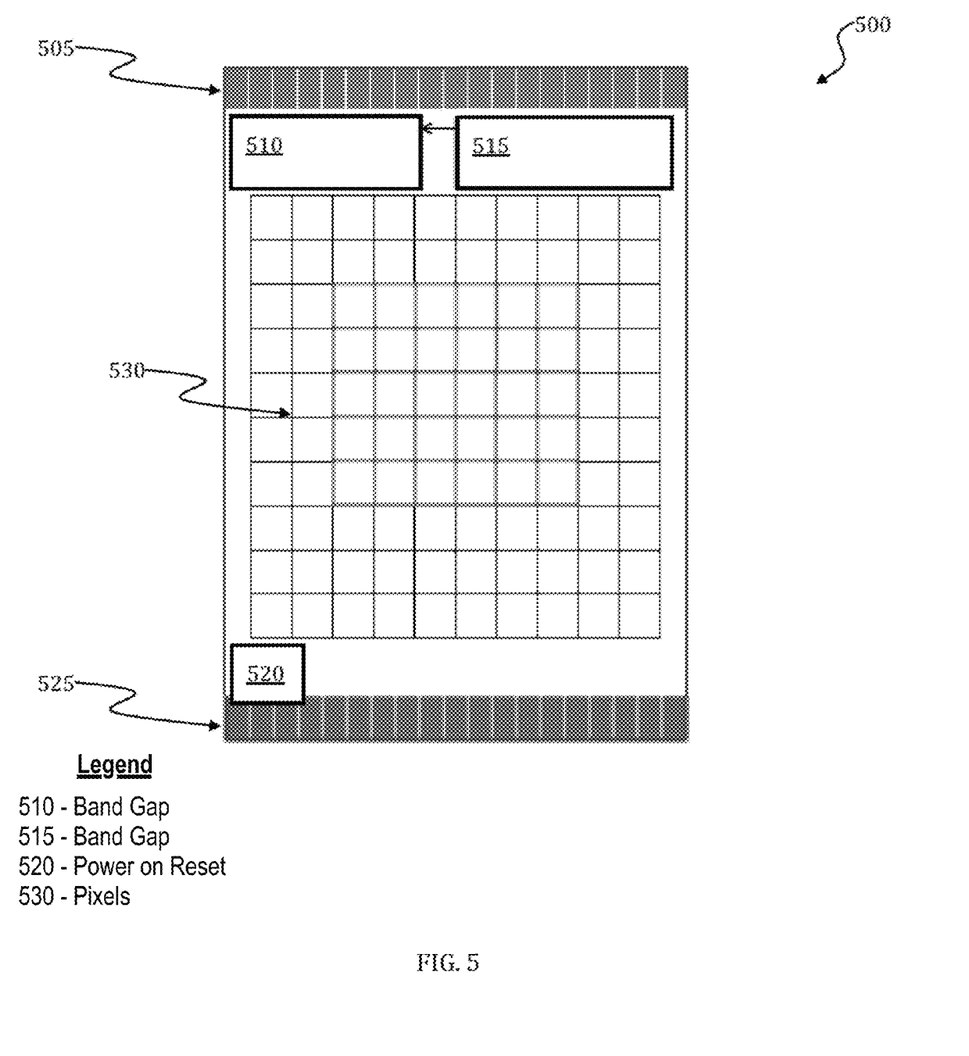
FIG. 5 depicts a block diagram of an ASIC in accordance with the disclosed embodiments.

FIG. 5 illustrates an exemplary ASIC floor plan 500, which contains an array of pixels 530 in accordance with embodiments of the present invention. The pixel block diagram includes an active pixel area 530, a power on reset 520, DACs for band gap 515, and band gap 510. The ASIC block diagram further includes bias decoupling, I/O and Power pads 505 and 525. ASIC 500 may have additional functional blocks (not shown) such as lines drivers, receivers, buffers, etc.

In an embodiment of an ASIC 500 which contains an array of pixels 530, the ASIC 500 may be embodied as a full reticule size ASIC of 19.6 mm×21.6 mm which can contain 22,500 pixels (150×150 array) with a pixel size of 130 μm×130 μm. This would correspond to an active pixel area of 19.5 mm×19.5 mm. The additional space on the ASIC can be used to add bandgaps 510 and DACs 515 to generate on chip biases, could additionally have ADC's to convert the analog output to a digital signal, and pads 505 and 525 for providing power to the ASIC, decoupling of biases, and analog output of storage capacitors.

Figure 6:
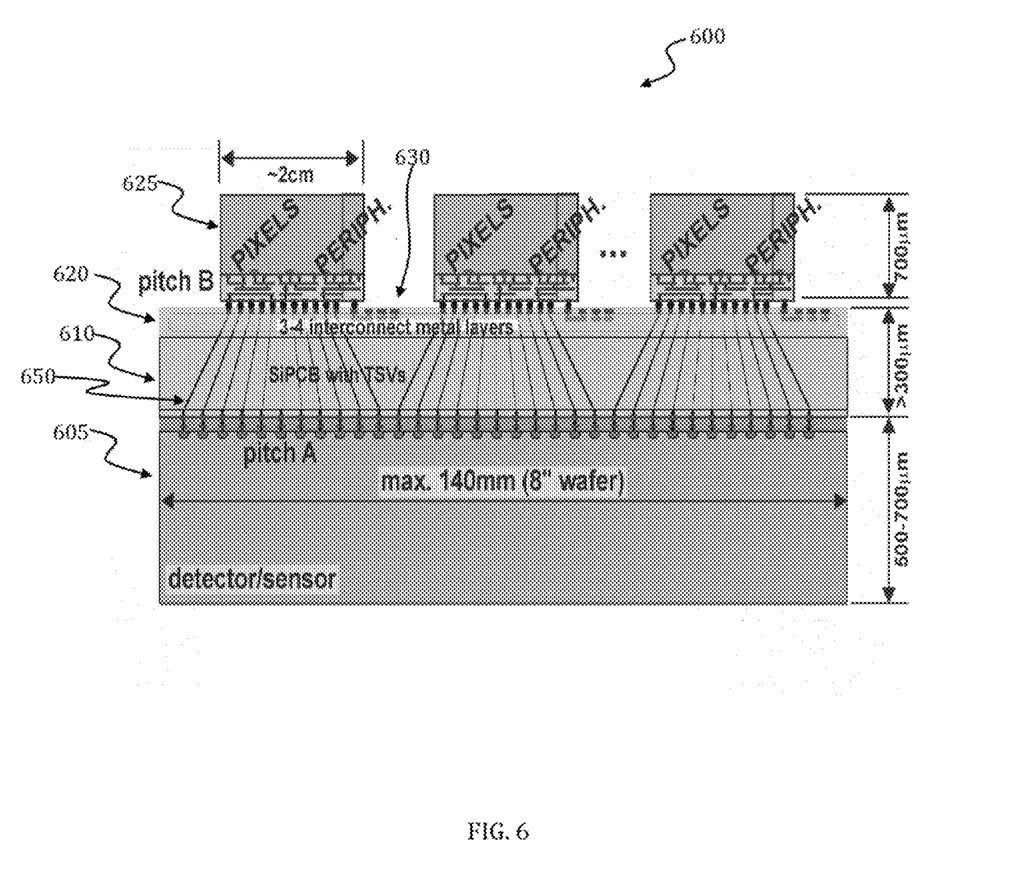
FIG. 6 depicts a block diagram of a large area, highly segmented pixilated detector system in accordance with the disclosed embodiments.

Wafer scale integration can be achieved via an interposer, optionally embodied as an SiPCB. FIG. 6 illustrates an exemplary embodiment 600 of the system 100 illustrated in FIG. 1. It should be appreciated that the dimensions shown in FIG. 6 are exemplary and are not intended to limit the invention.

The interposer 610 can be used for tapered pitch adaptation, where pitch A associated with detector/sensor 705 is greater than pitch B associated with interposer 610. System 600 can include fusion bonding (or any other type of surface-to-surface bonding techniques) of SiPCB interposer 610 to an n-on-p type sensor 605. Interposer 610 includes TSVs 650 and one or more metal interconnection layers 620 (separated by dielectric layers and connected through inter-metal vias). The system 600 includes routing power I/Os 630. It should be understood that interposer 610 provides additional shielding of the ASICs 625 for better radiation hardness. It should be understood that the thru vias are vertical (unless technology permits other angles). The tapering is achieved by the horizontal/vertical or diagonal metal traces of the plurality of metal layers, above, and below the thru vias.

In the embodiment shown for a detector 605, pitch A of 150 µm×150 µm and a pixel array of 150×150, provides a total area is 22.5 mm×22.5 mm. The ASIC 625 pixel area is smaller, thus, pitch A needs to be tapered to 130 µm×130 µm with a total active area of 19.5 mm×19.5 mm and an ASIC 625 size of 19.6 mm×21.6 mm. With the exemplary geometry of FIG. 6, the vertical and horizontal space between ASICs 625 would be 0.9 mm and 2.9 mm respectively. The horizontal space can be used for routing power and analogue signals from the ASIC 625 to the connector.

Figure 7:
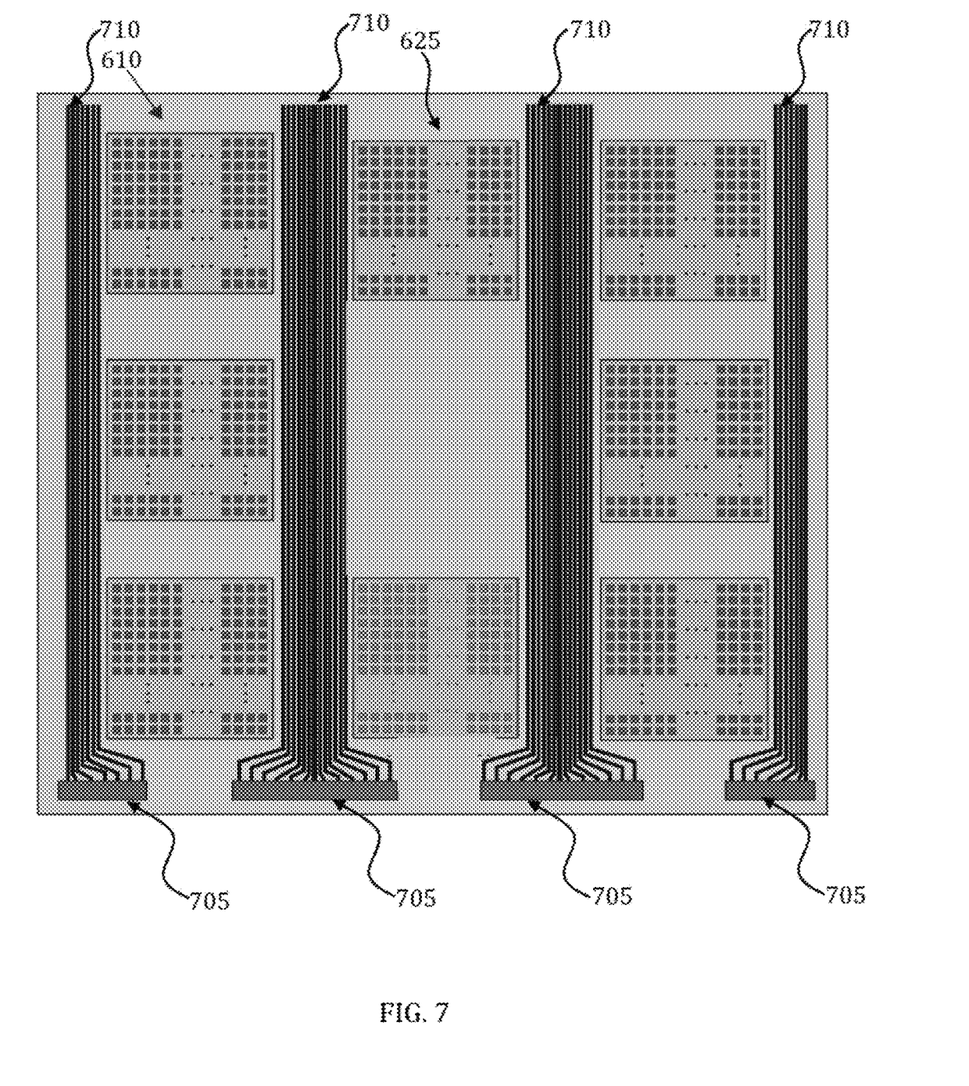
FIG. 7 depicts a top view of an interposer in accordance with the disclosed embodiments.

FIG. 7 illustrates a plan view of an interposer 610 configured as an SiPCB or glass PCB in accordance with embodiments of the invention. For reference, a sensor could be connected to this interposer as described herein, but would be underneath, and therefore out of the view shown in FIG. 7. The interposer 610 includes connections 705 to a plurality of ASICs 625 via traces 710 to allow communication with the ASICs. It should be appreciated that any number of rows and columns of ASICs could be included depending on the size of the interposer 610. In one embodiment, this may include 6 rows by 6 columns of ASICs 625.

Figure 8:
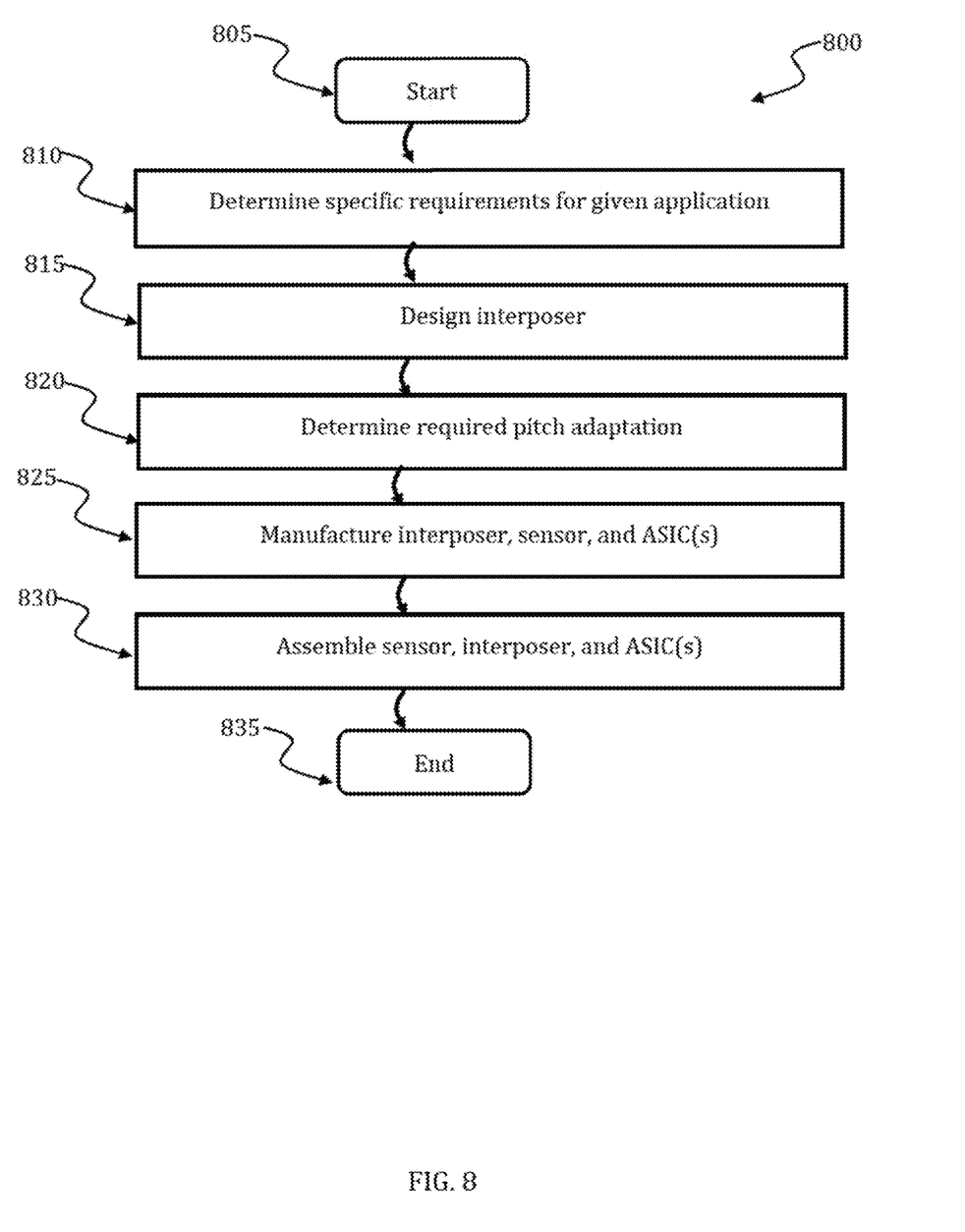
FIG. 8 depicts logical operational steps associated with a method for fabricating a detector in accordance with the disclosed embodiments.

FIG. 8 illustrates logical operational steps associated with a method 800 for fabricating the systems and apparatuses described herein. The method begins at step 805. At step 810 specific requirements for a given application can be determined. This step can include determining ASIC functionality and pixel size, defining a sensor area, sensor material, and sensor pixel size, and determining an interposer material and evaluating the associated technology.

This may include determining a detector pixel size (a×b) and array size (n×m). The detector sensitive area is then given as a×n×b×m. The ASIC pixel size is similarly given as (a'×b') and a single ASIC array size (n'×m') can be received. It should be understood that a>a'; b>b'; n>n'; m>m'. The single ASIC is then a'×n×x×b'×m' plus any peripheral area for pads and control circuitry. The number of ASICs required per detector is then calculated as:

$$\text{Area}(R') = (a' \times n') \times (b \times m') = \text{peripheral area} \quad (1)$$

The number of ASICs required per detector is then given by $$N(\text{detectors}) = h \times v \quad (2)$$

$$h = n/n' \quad (3)$$

$$v = m/m' \quad (4)$$

Accordingly, the available spacing for routing power and output signals between adjacent ASICs is an'−a'n' in the x-axis and bm'−b'm' in the y-axis.

Next at step 815 the interposer can be designed. The interposer must be at least as big as the sensor size plus the periphery area for power and signal routing. Pitch adaptation is determined at step 820. The top layer of the interposer may contain bumpbond pads. The individual sizes can be determined by bump technology. The bumpbond pads are arranged in subgroups to bond multiple ASICs. Spacing between pads is required to provide space for power and signal routing from the ASICs. Intermediate layers of the interposer may include one or more sheets and are used for connecting the array patterns of the bottom layer to the bumpbond pads of the top layer. This establishes connections between sensor pixels and ASIC pixels. The intermediate layers can also be used for routing signal and power from the additional ASIC pads to the periphery of the interposer and to create a shielding plane against crosstalk. The bottom layer contains metal pads, the individual sizes of which are determined by the requirements of the thru via design rule. The bottom layer pattern contains an n×m array matching the sensor pixel pitch.

Next at step 825, the sensor, ASIC(s), and interposer can be manufactured. At step 830, the various components are assembled. The sensor can be bonded to the interposer using the thru vias, but the type of via and bonding method will be determined when the interposer technology is selected. The ASICs are bump bonded, or otherwise connected via any other known interconnection technique, to the other side of the interposer.

In an alternative step, the ASICs can be tested. Additional components can also be added and any type of connectivity can be used at the periphery of the interposer to supply power and read output, etc. The method ends at step 835.

In sum, the disclosed embodiments (particularly for APS embodiments) provide a wafer size, dead-area free, seamless X-ray detector. The detector provides high fabrication yield by mounting multiple preselected good ASICs on a flat bed comprising a sensor wafer fused to an interposer. Tapered pitch adaptation can be achieved by using a silicon interposer with through silicon vias and multiple layers of routing. The interposer shields the ASICs from radiation damage. Large dynamic range can be achieved while maintaining a small footprint pixel with a front-end based on a bipolar current splitter concept. The analog front end with the current splitter provides low impedance input to efficiently absorb the detector signal, splitting it into scaled ranges whose split ratios remain constant over large dynamic range. The embodiments provide low power consumption by current splitting and shunting away most of any large signal (which does not impact the Signal-to-Noise ratio since this is limited by Poisson statistics for large signals). The signal is integrated without the need for its image to be "sourced" by an amplifier. The signal itself does all the work. For big signals, most of the input charge is simply shunted away, or "dumped". Very modest DC bias currents not exceeding a few 10's of uA are required, resulting in relatively low power dissipation. The biggest integration capacitance value required can be limited to only 3.2 pF as opposed to prior approaches which may require 100 pF or more. With a properly tuned feedback amplifier, the input impedance is purely resistive up to very high frequencies (>GHz). Since integration is performed on all 3 ranges simultaneously, there is no range switching on the fly and the input stays very clean. (The range of interest must then be determined after integration is complete.) The embodiments disclosed herein are modular, hence the sensor material can be changed to any material that can be grown in wafer scale and can also be used for energy ranges beyond that of Silicon.

Based on the foregoing, it can be appreciated that a number of embodiments, preferred and alternative, are disclosed herein. For example, a large area, gapless, detection system comprises at least one sensor; an interposer operably connected to the at least one sensor; and at least one application specific integrated circuit operably connected to the sensor via the interposer wherein the detection system provides high dynamic range while maintaining small pixel area and low power dissipation. The at least one sensor further comprises a pixilated sensing material configured to produce charge signals in response to incident electromagnetic radiation. The sensor further comprises at least one sensor pixel defined by a segmentation of the pixilated sensing material.

In another embodiment, the interposer further comprises at least one material sheet, a plurality of through holes formed for electrical connection, a plurality of routing traces on at least one layer of the material sheet, and at least one pad configured to bond components to the interposer. The interposer connects the at least one sensor pixel and the at least one application specific integrated circuit. The interposer is configured as a pitch adaptor between the at least one pixel and the at least one pixel within one application specific integrated circuit.

In another embodiment, at least one application specific integrated circuit further comprises at least one ASIC pixel. The at least one ASIC pixel is operably connected with the at least one sensor pixel by the interposer.

In another embodiment, an analog front end is included, wherein the analog front end is configured for processing an input signal via current splitting with at least one multiple scaled ranges.

In another embodiment, a method for gapless data detection comprises configuring at least one sensor to collect incident electromagnetic radiation; operably connecting the at least one sensor to an interposer; and connecting the sensor to at least one application specific integrated circuit wherein the application specific integrated circuit is operably connected to the sensor via the interposer wherein the detection method provides high dynamic range while maintaining small pixel area and low power dissipation.

In another embodiment, the method further comprises: configuring the at least one sensor to be a pixilated sensing material configured to produce charge signals in response to incident electromagnetic radiation. The method also comprises defining the at least one sensor pixel by a segmentation of the pixilated sensing material.

In another embodiment, the method further comprises configuring the interposer as at least one material sheet, a plurality of through holes formed for electrical connection, a plurality of routing traces on at least one layer of the material sheet, and at least one pad configured to bond components to the interposer. The method further comprises connecting the at least one sensor pixel and the at least one application specific integrated circuit via the interposer. The method also comprises configuring the interposer as a pitch adaptor between the at least one sensor pixel and the at least one pixel within one application specific integrated circuit.

In another embodiment, the at least one application specific integrated circuit further comprises at least one ASIC pixel. The method also comprises operably connecting the at least one ASIC pixel with the at least one sensor pixel by the interposer.

In another embodiment, the method further comprises connecting an analog front-end of a pixel in the application specific integrated circuit and processing an input signal via current splitting with at least one multiple scaled ranges associated with the analog front end.

In yet another embodiment, a large area, gapless, detection apparatus comprises at least one sensor; an interposer operably connected to the at least one sensor; and at least one application specific integrated circuit operably connected to the sensor via the interposer wherein the detection system provides high dynamic range while maintaining small pixel area and low power dissipation.

In another embodiment of the apparatus, the at least one sensor further comprises a pixilated sensing material configured to produce charge signals in response to incident electromagnetic radiation and wherein the sensor further comprises at least one sensor pixel defined by a segmentation of the pixilated sensing material; and the interposer further comprises at least one material sheet, a plurality of thru holes formed for electrical connection, a plurality of routing traces on at least one layer of the material sheet, and at least one pad configured to bond components to the interposer, and wherein the interposer connects the at least one sensor pixel and the at least one application specific integrated circuit.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art, which are also intended to be encompassed by the following claims.

What is claimed is:

1. A detection system comprising:
a monolithic pixilated sensor comprising a uniformly segmented pixilated sensing material wherein at least one sensor pixel is defined by said segmentation of said pixilated sensing material;
an interposer comprising one or more substrates, two or more conducting layers configured on said substrates said conducting layers being isolated by one or more dielectric layers, a plurality of electrically conducting inter-layer via connections, and a plurality of electrically conducting thru holes in said substrate arranged such that one of said conducting layers is operably and mechanically connected to said monolithic pixilated sensor, wherein said interposer is physically sized to be equal to or greater than a physical size of said uniformly segmented sensor area;
a plurality of application specific integrated circuits further comprising a plurality of pixels associated with each of said plurality of application specific integrated circuits arranged such that one of said conducting layers is operably connected to said plurality of application specific integrated circuits;
wherein every of said at least one sensor pixel has a corresponding ASIC pixel comprising an analog front-end configured to process an input signal via a bipolar current splitter, said bipolar current splitter comprising a passive integrator and at least one current splitter configured to simultaneously integrate a split current over a plurality of ranges wherein each of said plurality of ranges is of a different scale;
wherein said interposer provides pitch adaptation between said monolithic pixilated sensor and said plurality of pixels associated with each of said plurality of application specific integrated circuits; and wherein said monolithic pixilated sensor, said interposer, and said plurality of application specific integrated circuits are fabricated independently and merged to form said detection system.

2. The system of claim 1 wherein said interposer further comprises:
a plurality of routing traces on said at least one of said at least two conducting layers; and
at least one pad configured to bond components to said interposer.

3. The system of claim 2 wherein said interposer connects said at least one sensor pixel and said corresponding ASIC pixel associated with one of said plurality of application specific integrated circuits with said plurality of electrically conducting inter-layer via connections isolating said two or more conducting layers such that the stray capacitance of the connection between said at least one sensor pixel and said corresponding ASIC pixel is minimized.

4. The system of claim 2 wherein said interposer is configured as a pitch adaptor between said at least one sensor pixel and said corresponding ASIC pixel associated with one of said plurality of application specific integrated circuits, wherein each of said plurality of application specific integrated circuits have more than one circuit topologies configured to produce different functionality.

5. The system of claim 1 wherein said Monolith c pixilated sensor comprises at least one million pixels.

6. A method for gapless data detection comprising:
configuring a monolithic pixilated sensor with a uniformly segmented sensor area to collect incident electromagnetic radiation wherein said monolithic pixilated sensor comprises a pixilated sensing material;
defining at least one sensor pixel by segmentation of said pixilated sensing material configured to produce charge signals in response to incident electromagnetic radiation;
configuring an interposer to be physically sized to be equal to or greater than a physical size of said uniformly segmented sensor area wherein said interposer comprises one or more substrates, two or more conducting layers configured on said substrates said conducting layers being isolated by one or more dielectric layers, a plurality of electrically conducting inter-layer via connections, and a plurality of electrically conducting thru holes in said substrate arranged such that one of said conducting layers is operably and mechanically connected to said monolithic pixilated sensor;
connecting a plurality of application specific integrated circuits, to one of said conducting layers, said plurality of application specific integrated circuits further comprising a plurality of pixels associated with each of said plurality of application specific integrated circuits, said ASIC pixels further comprising an analog front-end configured to process an input signal via a bipolar current splitter;
associating every of said at least one sensor pixel with a corresponding ASIC pixel wherein said ASIC pixel is smaller than said sensor pixel;
simultaneously integrating a split current over a plurality of ranges with said bipolar current splitter, comprising a passive integrator and at least one current splitter, wherein each of said plurality of ranges is of a different scale;
providing pitch adaptation between said monolithic pixilated sensor and said plurality of pixels associated with each of said plurality of application specific integrated circuits with said interposer; and
merging said monolithic pixilated sensor, said interposer, and said plurality of application specific integrated circuits during fabrication to form said detection system.

7. The method of claim 6 further comprising:
configuring said interposer as a plurality of routing traces on said at least one of said at least two conducting layers; and,
at least one pad configured to bond components to said interposer.

8. The method of claim 7 further comprising
connecting said at least one sensor pixel and said corresponding ASIC pixel associated with one of said plurality of application specific integrated circuits with said plurality of electrically conducting inter-layer via connections isolating said two or more conducting layers such that the stray capacitance of the connection between said at least one sensor pixel and said corresponding ASIC pixel is minimized.

9. The method of claim 8 further comprising:
configuring said interposer as a pitch adaptor between said at least one sensor pixel and said corresponding ASIC pixel associated with one of said plurality of application specific integrated circuits wherein each of said plurality of application specific integrated circuits have more than one circuit topologies configured to produce different functionality.

10. The method of claim 6 wherein said monolithic pixilated sensor comprises at least one million pixels.

11. A large area, gapless, detection apparatus comprising:
a monolithic pixilated sensor comprising a uniformly segmented pixilated sensing material wherein at least one sensor pixel is defined by said segmentation of said pixilated sensing material;
an interposer comprising one or more substrates, two or more conducting layers configured on said substrates said conducting layers being isolated by one or more dielectric layers, a plurality of electrically conducting inter-layer via connections, and a plurality of electrically conducting thru holes in said substrate arranged such that one of said conducting layers is operably and mechanically connected to said monolithic pixilated sensor, wherein said interposer is physically sized to be equal to or greater than a physical size of said uniformly segmented sensor area;
a plurality of application specific integrated circuits further comprising a plurality of pixels associated with each of said plurality of application specific integrated circuits arranged such that one of said conducting layers is operably connected to said plurality of application specific integrated circuits;
wherein every of said at least one sensor pixel has a corresponding ASIC pixel comprising an analog front-end configured to process an input signal via a bipolar current splitter, said bipolar current splitter comprising a passive integrator and at least one current splitter configured to simultaneously integrate a split current over a plurality of ranges wherein each of said plurality of ranges is of a different scale;
wherein said interposer provides pitch adaptation between said monolithic pixilated sensor and said plurality of pixels associated with each of said plurality of application specific integrated circuits; and
wherein said monolithic pixilated sensor, said interposer, and said plurality of application specific integrated circuits are fabricated independently and merged to form said detection apparatus.

12. The apparatus of claim 11 wherein said monolithic pixilated sensor further comprises a pixilated sensing material configured to produce charge signals in response to incident electromagnetic radiation and wherein at least one sensor pixel is defined by said segmentation of said pixilated sensing material; and wherein said interposer further comprises:
a plurality of routing traces on said at least one of said at least two conducting layers; and
at least one pad configured to bond components to said interposer.

* * * * *